United States Patent [19]

Nakamura

[11] Patent Number: 5,331,219
[45] Date of Patent: Jul. 19, 1994

[54] SEMICONDUCTOR INTEGRATED CIRCUIT WITH SELECTIVE INTERFACING ON DIFFERENT INTERFACE LEVELS

[75] Inventor: Kazuyuki Nakamura, Tokyo, Japan

[73] Assignee: NEC Corporation, Tokyo, Japan

[21] Appl. No.: 964,864

[22] Filed: Oct. 22, 1992

[30] Foreign Application Priority Data

Oct. 28, 1991 [JP] Japan .................. 3-281414

[51] Int. Cl.⁵ .............. H03K 19/0175; H03K 19/173
[52] U.S. Cl. .............................. 307/475; 307/465; 365/189.11
[58] Field of Search ........... 307/465, 443, 475; 365/230.06, 189.11

[56] References Cited

U.S. PATENT DOCUMENTS 4,472,647 9/1984 Algood .................. 307/475
4,527,079 7/1985 Thompson .............. 307/443
4,975,602 12/1990 Nhu ...................... 307/475

OTHER PUBLICATIONS

1992 IEEE International Solid-State Circuits Conference (Feb. 21, 1992).
1990 The Institute Electronics, Information and Communication Engineers Spring Conference Paper C-699.

*Primary Examiner*—Edward P. Westin
*Assistant Examiner*—Andrew Sanders
*Attorney, Agent, or Firm*—Leydig, Voit & Mayer

[57] ABSTRACT

A semiconductor integrated circuit such as an LSI circuit for use as a semiconductor static memory is fabricated on one chip and can handle signals on different interface levels. The semiconductor integrated circuit has ECL and CMOS input buffers which can be selected or simultaneously connected by a selector switch and ECL and CMOS output buffers which can be selected or simultaneously connected by a selector switch. The semiconductor integrated circuit with the selectively usable input and output buffers serves as either one of integrated circuits of different interface types. When the ECL input buffer and the CMOS output buffer are selected, an ECL-to-CMOS level converter and a sense amplifier may be implemented by one circuit block.

3 Claims, 6 Drawing Sheets

SEMICONDUCTOR INTEGRATED CIRCUIT WITH SELECTIVE INTERFACING ON DIFFERENT INTERFACE LEVELS

BACKGROUND OF THE INVENTION

The present invention relates to a semiconductor integrated circuit, and more particularly to a semiconductor integrated circuit which is composed of an LSI circuit fabricated on one chip and capable of selective interfacing on different interface levels for an increased number of functions and a higher degree of circuit integration.

Description of the Related Art:

Recent semiconductor integrated circuit fabrication technology makes it possible to provide more than one million transistors on one chip due to advanced scaling down of MOS transistor device size. Bi-CMOS integrated circuits which are composed of bipolar devices and CMOS devices put together on one chip for combined characteristics thereof are finding wide use. Bi-CMOS integrated circuits may be combined with a high-speed ECL (Emitter-Coupled Logic) and a low-power CMOS circuit to realize a logic circuit which can operate at high speed and has low power requirements.

Efforts have been made to fabricate a high-speed, low-power semiconductor static memory using a Bi-CMOS integrated circuit. For example, Collected Papers C-699 of Lectures for Spring National Convention, Electronic Information Communications Society, 1990 show a semiconductor static memory comprising a Bi-CMOS integrated circuit as an LSI circuit. The disclosed semiconductor static memory uses, as input/output interface levels, an ECL level having a small logic amplitude of about 0.8 V and capable of transferring signals at high speed. Since the LSI circuit is a low-power CMOS integrated circuit, it is necessary to convert an input signal with ECL levels to a signal with CMOS levels whose logic amplitude is approximately equal to a power supply voltage.

Conventional semiconductor static memories, constructed as semiconductor integrated circuits, with ECL and CMOS interfaces are substantially identical in circuit arrangement except for those interfaces. However, since the semiconductor static memories are designed and manufactured as different integrated circuits, they cannot be designed and manufactured with efficiency.

Some high-performance computer systems require cache memories for an exchange of information between a CPU which operates at high speed with ECL levels and a main memory which comprises an inexpensive, large-capacity DRAM operating with CMOS levels or TTL levels. Therefore, the cache memories should transfer signals between different interface levels.

SUMMARY OF THE INVENTION

It is an object of the present invention to provide a semiconductor integrated circuit which comprises an LSI circuit fabricated on one chip for selective interfacing on different interface levels, so that the semiconductor integrated circuit can be designed and manufactured highly efficiently and has a reduced number of peripheral LSI circuits such as a level converting LSI circuit.

According to the present invention, there is provided a semiconductor integrated circuit comprising a plurality of input buffers for respectively inputting signals having a plurality of different input interface levels. A plurality of output buffers respectively outputting signals having a plurality of different output interface levels. A selector for selectively connecting the input buffers and the output buffers for enabling the semiconductor integrated circuit to operate using different input and output interface levels. The semiconductor integrated circuit further includes a semiconductor memory and an amplifying circuit. The amplifying circuit includes a first amplifying mechanism for amplifying an input signal having a logic amplitude corresponding to a lower one of the different input interface levels supplied from the input buffers selectively connected by the selector. The amplified input signal is applied to the semiconductor memory. The amplifying circuit includes a second amplifying mechanism for amplifying a readout signal supplied from the semiconductor memory and having a logic amplitude corresponding to a higher one of said different output interface levels. The amplified readout signal is applied to the output buffers selectively connected by the selector.

The semiconductor integrated circuit with the selectively usable input and output buffer means can serve as either one of integrated circuits of different interface types. Therefore, semiconductor integrated circuits of such a configuration can be designed and manufactured highly efficiently for selective interfacing on different interface levels.

When the plural input buffer means and the plural output buffer means are simultaneously selected, the different interface levels can directly be connected to each other, with a resulting reduction in the number of peripheral LSI circuits such as a level converting LSI circuit.

The semiconductor integrated circuit may also have a level converter and a sense amplifier, which may be implemented by one circuit block if the input and output signals are of different interface levels.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
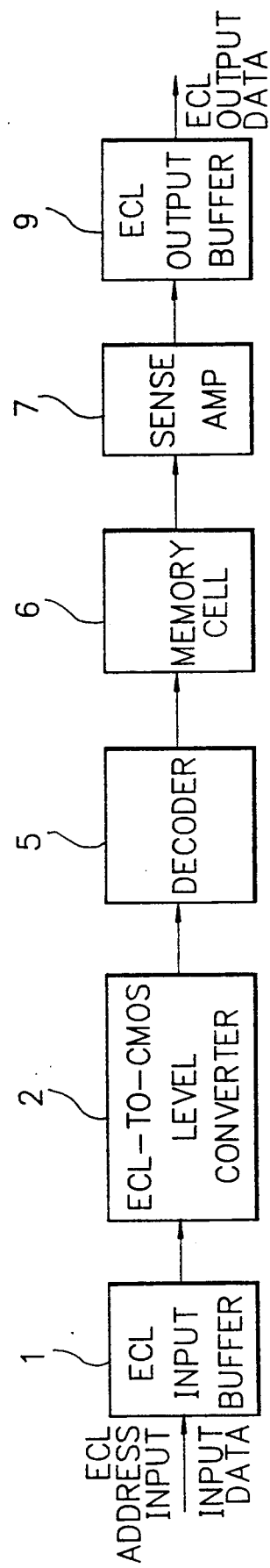
FIG. 1 is a block diagram of a conventional semiconductor integrated circuit.

Like or corresponding parts are denoted by like or corresponding reference numerals throughout views.

For a better understanding of the present invention, conventional semiconductor integrated circuits will first be described below with reference to FIGS. 1 and 2.

FIG. 1 shows, in block form, a conventional semiconductor integrated circuit. The semiconductor integrated circuit shown in FIG. 1 is in the form of a semiconductor static memory. The semiconductor integrated circuit has an ECL input buffer 1 for being supplied with an ECL address input signal or an input data signal, and an ECL-to-CMOS level converter 2 coupled to the ECL input buffer 1. The semiconductor integrated circuit also includes a decoder 5 for selecting a memory cell in a memory 6 based on an address input signal from the ECL-to-CMOS level converter 2, a sense amplifier 7 for amplifying a low-level readout signal from the memory 6 to an ECL level, and an ECL output buffer 9 connected to the sense amplifier 7.

Figure 2:
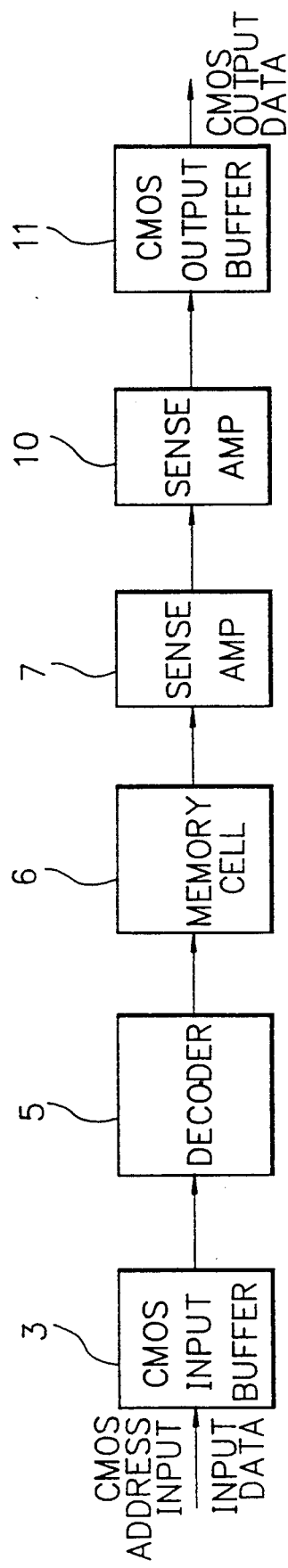
FIG. 2 is a block diagram of another conventional semiconductor integrated circuit.

FIG. 2 illustrates, in block form, another conventional semiconductor integrated circuit. The semiconductor integrated circuit shown in FIG. 2, which is in the form of a semiconductor static memory, has a TTL or CMOS input buffer 3 and a CMOS output buffer 11 that are widely used in input and output interfaces in LSI circuits. Since the level of input signals applied to the CMOS input buffer 3 is substantially the same as signal levels in the semiconductor integrated circuit, the semiconductor integrated circuit requires no ECL-CMOS level converter. Therefore, an output signal from the CMOS input buffer 3 is sent directly to a decoder 5 which is connected to a memory cell 6. The semiconductor integrated circuit produces an output signal whose level is required to be substantially the same as the level of a power supply voltage. For this reason, it is necessary to amplify a readout signal from the memory 6 to a CMOS level. The semiconductor integrated circuit includes a first sense amplifier 7 having the same amplification degree as that of the sense amplifier 7 shown in FIG. 1, for amplifying a readout signal from the memory cell 6 to about 0.8 V, and a second sense amplifier 10 for amplifying an output signal from the first sense amplifier 10 to the power supply voltage. The second sense amplifier 10 applies an amplified output signal to the CMOS output buffer 11.

The conventional semiconductor static memories illustrated in FIGS. 1 and 2, constructed as semiconductor integrated circuits, are substantially identical in circuit arrangement except for the input and output interfaces. However, the semiconductor static memories cannot be designed and manufactured with efficiency as they are designed and manufactured as different integrated circuits.

Figure 3:
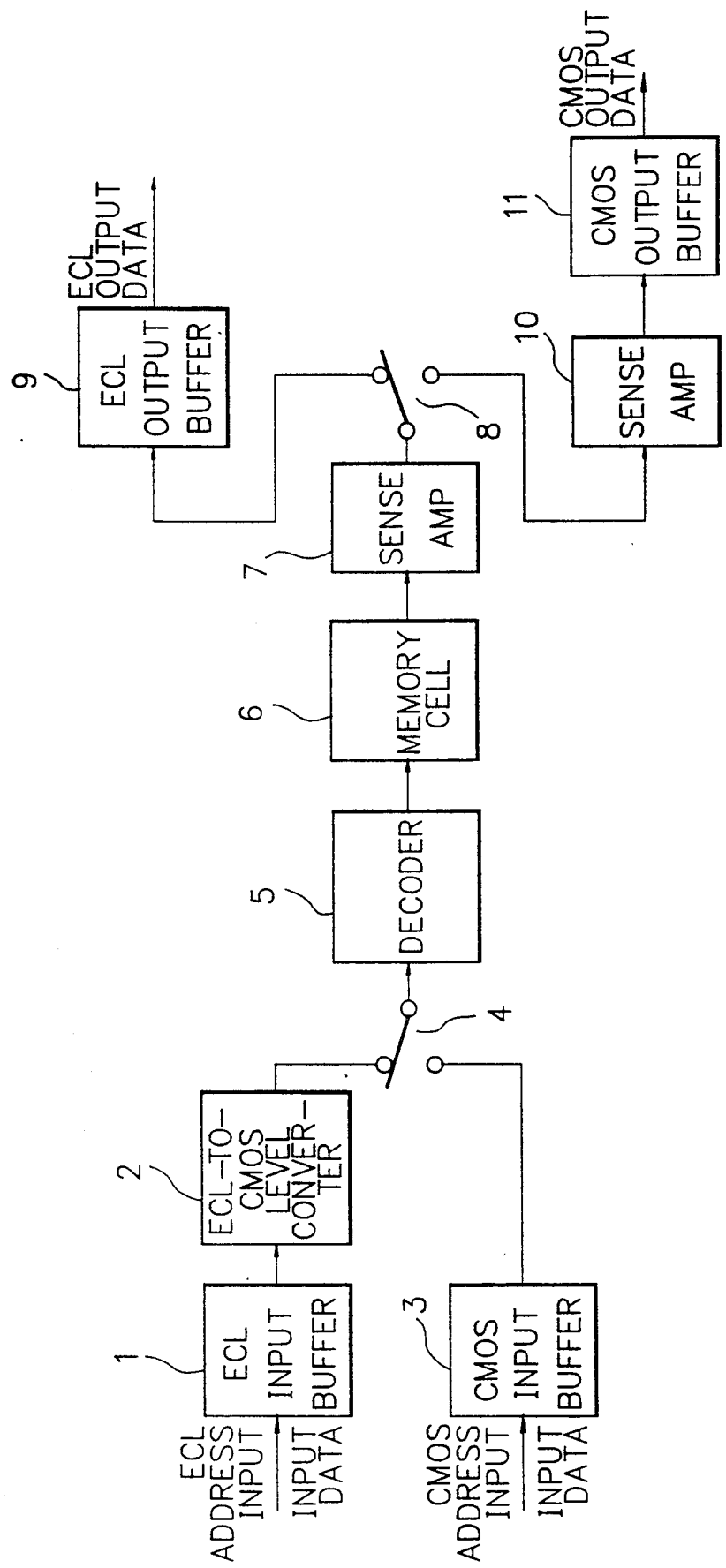
FIG. 3 is a block diagram of a semiconductor integrated circuit according to a first embodiment of the present invention.

FIG. 3 shows, in block form, a semiconductor integrated circuit comprising a semiconductor static memory as an LSI circuit according to a first embodiment of the present invention. As shown in FIG. 3, the semiconductor integrated circuit has an ECL input buffer 1 and a CMOS input buffer 3 for receiving input signals on different input interface levels, and an ECL output buffer 9 and a CMOS output buffer 11 for producing output signals on different output interface levels. The ECL input buffer 1 is connected to an ECL-to-CMOS level converter 2 which converts a signal on an ECL level to a signal on a CMOS level that approximates a power supply voltage. An input selector switch 4 selects one, at a time, of output signals from the ECL-to-CMOS level converter 2 and the CMOS input buffer 3, i.e., selects one of the different input interface levels.

The semiconductor integrated circuit also has a decoder 5 operating on the CMOS level for selecting a memory cell in a memory cell 6 in response to an address input signal applied to the decoder 5. A first sense amplifier 7 serves to amplify a readout signal from the memory cell 6 to the ECL level of about 0.8 V, and a second sense amplifier 10 serves to a readout signal from the ECL level to the CMOS level which is about the same as the power supply level. The second sense amplifier 10 applies an amplified output signal to the CMOS output buffer 11. An output selector switch 8 supplies the amplified output signal from the second sense amplifier 7 selectively to the ECL output buffer 9 or the second sense amplifier 10, i.e., selects one, at a time, of the different output interface levels.

Each of the input and output selector switches 4, 8 may be one of selectable patterns of interconnection layers or electric switches in the semiconductor integrated circuit. Each of the input and output selector switches 4, 8 may be arranged to simultaneously turn on two interface level circuits to which it is connected. For example, the output selector switch 8 may be arranged to supply the readout signal from the memory cell 6 simultaneously to the ECL output buffer 9 and the CMOS output buffer 11. This may result in a reduction in the number of peripheral LSI circuits such as a level converting LSI circuit.

In the semiconductor integrated circuit shown in FIG. 3, the decoder 5, the memory cell 6, and the sensing amplifier 7 can handle signals on different interface levels simply by selecting desired input and output buffers with the selector switches 4, 8. The semiconductor integrated circuit with the selectively usable input and output buffers actually serves as either one of integrated circuits of different interface types. Therefore, semiconductor integrated circuits of such a configuration can be designed and manufactured highly efficiently for selective interfacing on different interface levels.

Figure 4:
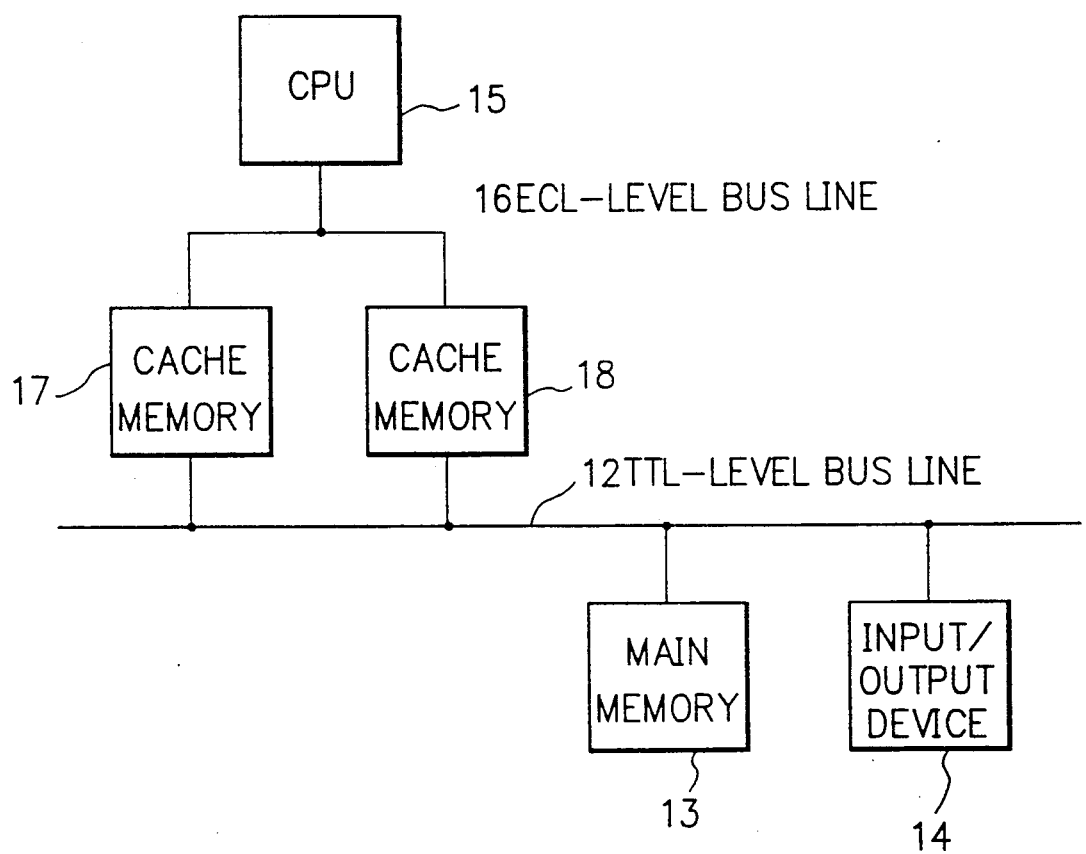
FIG. 4 is a block diagram of an arrangement to which the semiconductor integrated circuit shown in FIG. 3 is applied.

The semiconductor integrated circuit shown in FIG. 3 may be incorporated in a computer system as shown in FIG. 4. As shown in FIG. 4, a high-performance computer system includes two cache memories 17, 18 for exchanging information at high speed between a central processing unit (CPU) 15 and a main memory 13. The cache memories 17, 18 are connected through a TTL-level bus line 12 to the main memory 13 and an input/output device 14. The CPU 15 is connected to the cache memories 17, 18 through an ECL-level bus line 16. In the computer system, the CPU 15 and the main memory 13 operate on different interface levels, i.e., an ECL level and a TTL level, respectively. Each of the cache memories 17, 18 is in the form of the semiconductor static memory as shown in FIG. 3 for transferring data signals between the CPU 15 and the main memory 13 on the different interface levels. Therefore, the cache memories 17, 18 can be connected directly to the CPU 15 and the main memory 13. The computer system is therefore relatively simple in arrangement and operable for higher processing speed.

Figure 5:
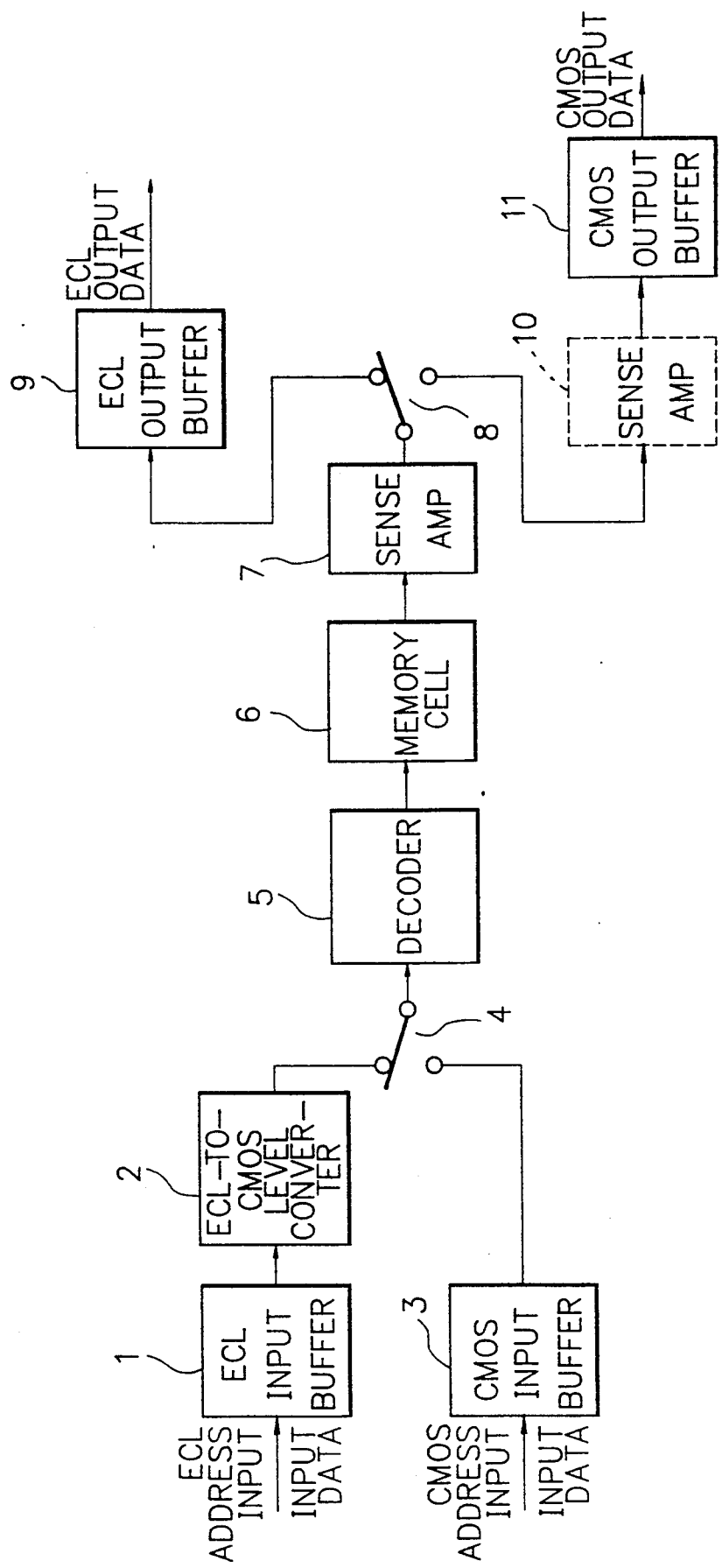
FIG. 5 is a block diagram of a semiconductor integrated circuit according to a second embodiment of the present invention.

FIG. 5 shows, in block form, a semiconductor integrated circuit according to a second embodiment of the present invention. In the semiconductor integrated circuit shown in FIG. 3, both the ECL-to-CMOS level converter 2 and the second sense amplifier 10 are capable of amplifying a signal having an amplitude of about 0.8 V which is about the same as the ECL level to a signal on the CMOS level which is about the same as the power supply voltage. In FIG. 5, the ECL-to- CMOS level converter 2 and the second sense amplifier 10 are implemented by one circuit block. That is, the ECL-to-CMOS level converter 2 doubles as the second sense amplifier 10, so that it can amplify an ECL-level input signal from the ECL buffer 1 and also an ECL-level output signal from the first sense amplifier 7 for supplying a CMOS-level signal to the CMOS output buffer 11. The semiconductor integrated circuit shown in FIG. 5 is therefore composed of a reduced number of circuit elements.

Figure 6:
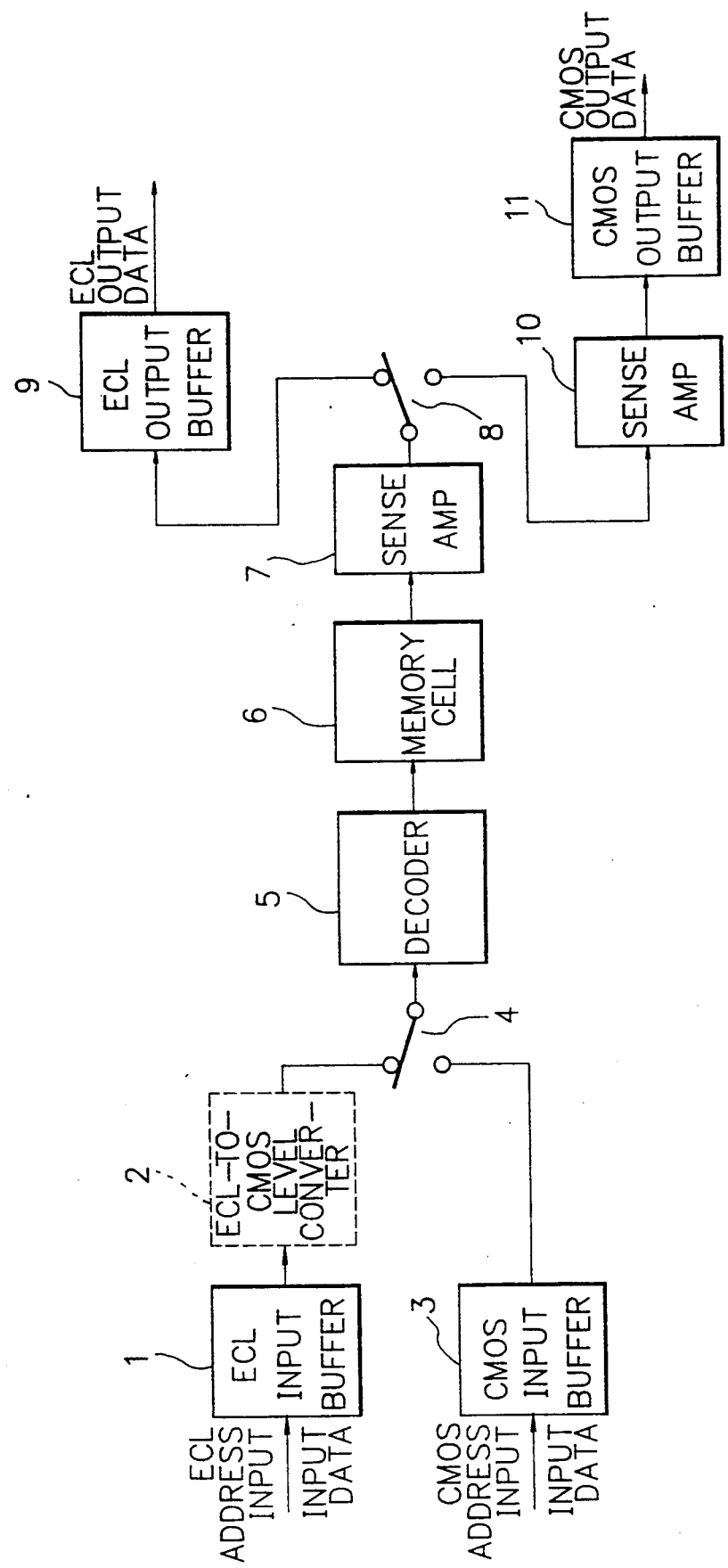
FIG. 6 is a block diagram showing a different manner in which the semiconductor integrated circuit shown in FIG. 5 is used.

The semiconductor integrated circuit shown in FIG. 5 may be used in a fashion shown in FIG. 6. In FIG. 6, the ECL-to-CMOS level converter 2 and the second sense amplifier 10 are also implemented by one circuit block, and the second sense amplifier 10 doubles as the ECL-to-CMOS level converter 2, so that it can amplify an ECL-level output signal from the first sense amplifier 7 for supplying a CMOS-level signal to the CMOS output buffer 11 and also an ECL-level input signal from the ECL input buffer 1.

In the case where two different input or output interfaces do not operate at the same time, the number of circuit elements used can be reduced as in FIGS. 5 and 6.

As described above, the semiconductor integrated circuit is in the form of an LSI circuit fabricated on one chip for selective interfacing on different interface levels. Therefore, the semiconductor integrated circuit can be designed and manufactured efficiently, and has a reduced number of peripheral LSI circuits such as a level converting LSI circuit.

While the present invention has been described with reference to the particular illustrative embodiments, it is not to be restricted by the embodiments but only by the appended claims. It is to be appreciated that those skilled in the art can change or modify the embodiments without departing from the scope and sprit of the present invention.

What is claimed is:

1. A semiconductor integrated circuit comprising:
    plurality of input buffer means for inputting signals on a plurality of different input interface levels, respectively;
    plurality of output buffer means for outputting signals on a plurality of different output interface levels, respectively;
    selector means for selectively connecting the input buffer means and the output buffer means, whereby the semiconductor integrated circuit can operate on the different input and output interface levels;
    a semiconductor memory;
    first amplifying means for amplifying an input signal supplied from the input buffer means selectively connected by the selector means and applying the amplified signal to the semiconductor memory, the signal having a logic amplitude corresponding to a lower one of the different input interface levels;
    second amplifying means for amplifying a readout signal supplied from the semiconductor memory to a logic amplitude corresponding to a higher one of the different output interface levels and applying the amplified readout signal to the output buffer means selectively connected by the selector means, wherein the first and second amplifying means are implemented by a single circuit.

2. A semiconductor integrated circuit comprising:
    a first amplifier receiving address signals having first logic voltage levels and level converting the address signals to second logic voltage levels, different from the first logic voltage levels;
    a decoder coupled to the first amplifier receiving the address signals having second logic voltage levels and outputting a select signal;
    a memory cell coupled to the decoder and selected by the select signal, the memory cell outputting a data output signal;
    a second amplifier coupled to the memory cell amplifying the data output signal and converting the data output signal to first logic voltage levels;
    means for coupling the data output signal having the first logic voltage levels to the first amplifier for enabling the first amplifier to level convert the data output signal having first logic voltage levels to a data output signal having second logic voltage levels.

3. The semiconductor integrated circuit of claim 2 wherein the first logic voltage levels are ECL logic voltage levels and the second logic voltage levels are CMOS logic voltage levels.

* * * * *